(12) United States Patent
Zhang et al.

(10) Patent No.: US 10,592,333 B2
(45) Date of Patent: Mar. 17, 2020

(54) DUAL-MODE ERROR-CORRECTION CODE/WRITE-ONCE MEMORY CODEC

(71) Applicant: TEXAS INSTRUMENTS INCORPORATED, Dallas, TX (US)

(72) Inventors: Sai Zhang, Urbana, IL (US); Yuming Zhu, Plano, TX (US); Clive Bittlestone, Lucas, TX (US); Srinath Ramaswamy, Murphy, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/633,835

(22) Filed: Jun. 27, 2017

(65) Prior Publication Data

US 2017/0293526 A1  Oct. 12, 2017

Related U.S. Application Data

(63) Continuation of application No. 14/720,442, filed on May 22, 2015, now Pat. No. 9,690,517.

(51) Int. Cl.
| *G06F 11/10* | (2006.01) |
| *G06F 3/06* | (2006.01) |
| *G11C 29/52* | (2006.01) |
| *H03M 13/15* | (2006.01) |
| *H03M 13/00* | (2006.01) |

(52) U.S. Cl.
CPC .......... *G06F 11/1068* (2013.01); *G06F 3/064* (2013.01); *G06F 3/0619* (2013.01); *G06F 3/0673* (2013.01); *G11C 29/52* (2013.01); *H03M 13/159* (2013.01); *H03M 13/616* (2013.01)

(58) Field of Classification Search
CPC .................................................. G06F 11/1008
USPC ................................ 714/766, 767, 769, 770
See application file for complete search history.

(56) References Cited

U.S. PATENT DOCUMENTS

| 8,091,010 B2 | 1/2012 | Yim |
| 9,086,955 B2 | 7/2015 | Jiang et al. |
| 2013/0091402 A1 | 4/2013 | Yaakobi |
| 2013/0297988 A1 | 11/2013 | Wu et al. |
| 2014/0143637 A1 | 5/2014 | Cohen et al. |
| 2016/0006462 A1 | 1/2016 | Hanham et al. |
| 2016/0188181 A1 | 6/2016 | Smith |

(Continued)

*Primary Examiner* — Fritz Alphonse
(74) *Attorney, Agent, or Firm* — Michael A. Davis, Jr.; Charles A. Brill; Frank D. Cimino

(57) ABSTRACT

A system for error correction code (ECC) management of write-once memory (WOM) codes includes, for example, a controller for selecting between one of a WOM (Write-Once Memory) mode and an ECC (error correction code) mode. A codec is arranged to operate in the selected mode. The codec while operating in the ECC mode is arranged to identify a bit position of at least one bit error in response to ECC parity bits of a first received data word. The codec while operating in the WOM mode is arranged to receive a WOM-encoded word from an addressed location in a WOM device, to receive a second received data word to be encoded and written to the addressed location, and to generate WOM-encoded word for writing to the addressed location in the WOM device. The WOM-encoded word for writing to the addressed location is optionally ECC encoded.

17 Claims, 6 Drawing Sheets

(56) References Cited

U.S. PATENT DOCUMENTS

2016/0342471 A1\* 11/2016 Zhang ................... G06F 3/0619
2017/0046090 A1\* 2/2017 Zhu ....................... G06F 3/0634

\* cited by examiner

DUAL-MODE ERROR-CORRECTION CODE/WRITE-ONCE MEMORY CODEC

CROSS REFERENCE TO RELATED APPLICATION(S)

This continuation application claims priority to U.S. patent application Ser. No. 14/720,442, filed May 22, 2015, which application is incorporated herein by reference.

BACKGROUND

Computer systems include processors that are operable to retrieve, process, and store data in memory devices. The memory devices used in computer systems include different kinds of memory devices, where the differing types of memory devices typically have different capabilities and operating characteristics. The type of memory device used in a particular system is selected in accordance with the requirements of a particular application of the computer system. For example, some system designs require the ability to write and read data to and from non-volatile memory locations. However, some memory device solutions (such as electrically erasable read-only memories) are unsuited for some applications due to increased cost and/or decreased performance characteristics.

SUMMARY

The problems noted above can be addressed in a system for dual-mode error correction code (ECC) and write-once memory (WOM) coding and decoding that includes, for example, a controller for selecting between one of a WOM mode and an ECC mode. A codec that is responsive to the controller is arranged to operate in the selected mode. The codec while operating in the ECC mode is arranged to identify a bit position of at least one bit error in response to ECC parity bits of a first received data word. The codec while operating in the WOM mode is arranged to receive a WOM-encoded word from an addressed location in a WOM device, to receive a second received data word to be encoded and written to the addressed location, and to generate WOM-encoded word for writing to the addressed location in the WOM device. The WOM-encoded word for writing to the addressed location is optionally ECC encoded.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion.

Figure 1:
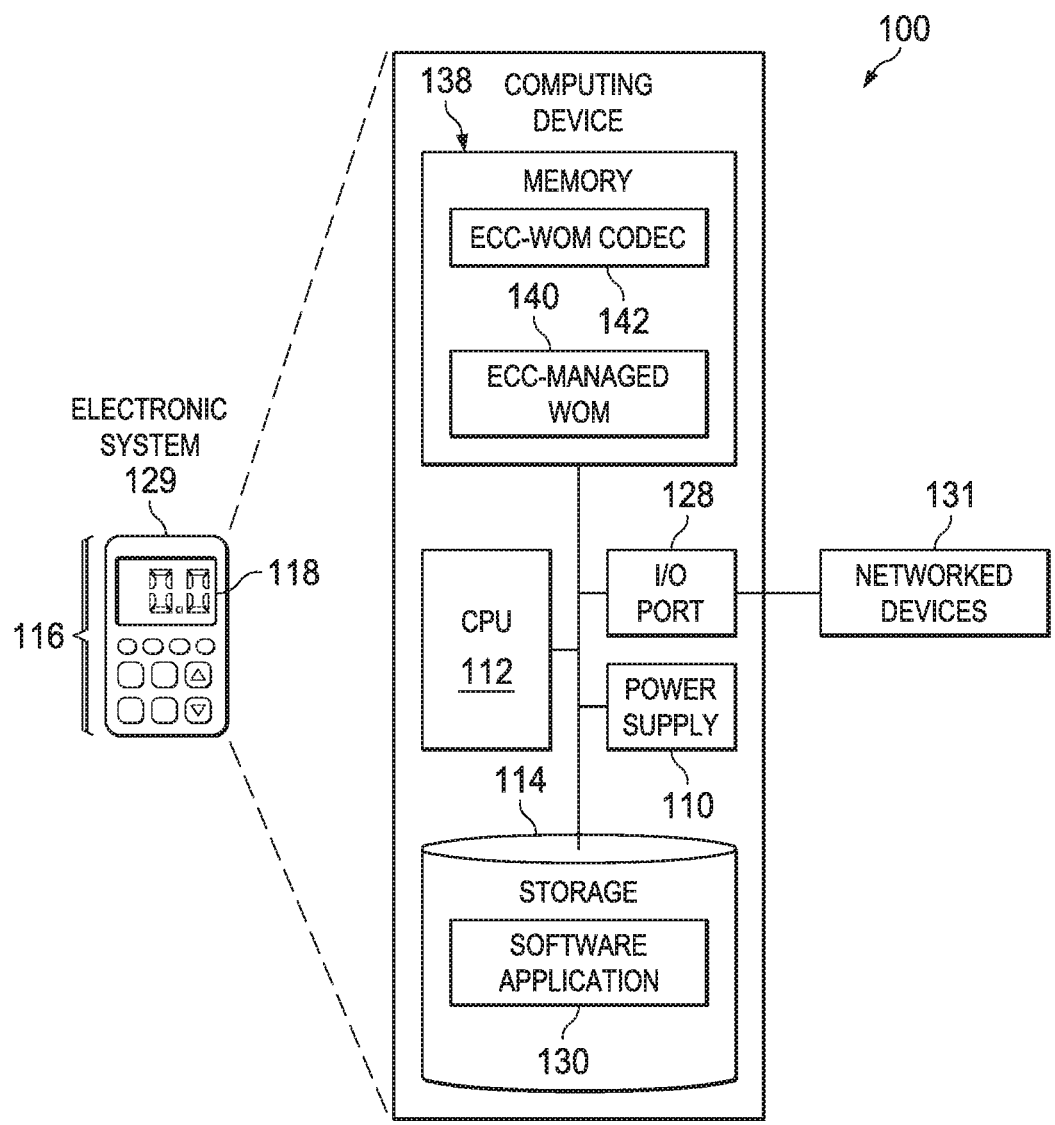
FIG. 1 shows an illustrative computing system in accordance with example embodiments of the disclosure.

FIG. 1 shows an illustrative computing system 100 in accordance with certain embodiments of the disclosure. For example, the computing system 100 is, or is incorporated into, an electronic system 129, such as a computer, electronics control "box" or display, communications equipment (including transmitters), or any other type of electronic system arranged to generate radio-frequency signals.

In some embodiments, the computing system 100 comprises a megacell or a system-on-chip (SoC) which includes control logic such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing system 100.

The CPU 112 comprises memory and logic that store information frequently accessed from the storage 114. The computing system 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and electrical and/or mechanical devices such as keypads, switches, proximity detectors, gyros, accelerometers, and the like. The CPU 112 is coupled to I/O (Input-Output) port 128, which provides an interface that is configured to receive input from (and/or provide output to) networked devices 131. The networked devices 131 can include any device capable of point-to-point and/or networked communications with the computing system 100. The computing system 100 can also be coupled to peripherals and/or computing devices, including tangible, non-transitory media (such as flash memory) and/or cabled or wireless media. These and other input and output devices are selectively coupled to the computing system 100 by external devices using wireless or cabled connections. The storage 114 can be accessed by, for example, by the networked devices 131.

The CPU 112 is coupled to I/O (Input-Output) port 128, which provides an interface that is configured to receive input from (and/or provide output to) peripherals and/or computing devices 131, including tangible (e.g., "non-transitory") media (such as flash memory) and/or cabled or wireless media (such as a Joint Test Action Group (JTAG) interface). These and other input and output devices are selectively coupled to the computing system 100 by external devices using or cabled connections. The CPU 112, storage 114, and power supply 110 can be coupled to an external power supply (not shown) or coupled to a local power source (such as a battery, solar cell, alternator, inductive field, fuel cell, capacitor, and the like).

The computing system 100 includes a memory 138. The memory 138 is suitable for relatively quick memory accesses and is typically formed using solid state memory devices. Such solid-state memory devices include the ECC- (electronic correction code-) managed WOM (write-once memory) 140. The WOM 140 is memory that is typically written once (or a relatively small number of times) before (for example) being discarded or erased.

The ECC-managed WOM 140 write accesses are typically faster than ECC-managed WOM 140 erase cycles (if any) and, in an embodiment, the write accesses are capable of changing a bit location in the ECC-managed WOM 140 from an erased state to a written state (such as a "0" to a "1"). The erased state typically depends on a technology selected, and accordingly can be either from a "0" to a "1," or a "1" to a "0," where the written state is typically the opposite of the erased state. (Some memory devices may store multiple bits of information in a single memory cell in which case the written bits include one of more bits of information that have a state opposite the erased state.)

The ECC-managed WOM 140 is written using a WOM code for efficiently writing to WOM such that the written-to WOM can be written to multiple times without (e.g., block) erasure. The ECC-managed WOM 140 can be used to provide cost-efficient non-volatile memory (NVM) having a limited reprograming capability and/or an enhanced number of write/erase cycles (e.g., as compared with conventional NVM solutions).

The memory 138 includes an ECC-WOM (dual-mode) codec (coder/decoder) 142. The codec 142 is operable to encode/decode ECC codes and to encode/decode WOM codes. As discussed below, the codec 142 performs ECC operations by computing syndromes using a syndrome computing block and by searching a syndrome table to locate errors. The codec 142 performs WOM operations by using the syndrome computing block as the decoder for WOM code, and reuses the syndrome table during the WOM encoding process. Accordingly, the codec 142 is operable to decode data words (e.g., received from a uniquely addressed location in a WOM device) that are both WOM-encoded and ECC decoded.

Figure 2:
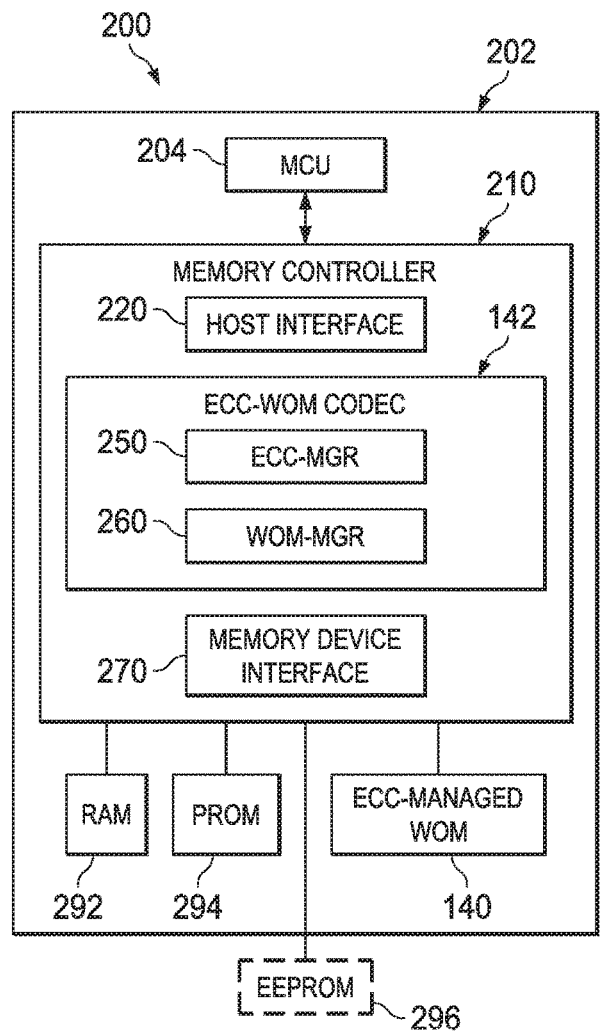
FIG. 2 is a block diagram of a processing system including an ECC-managed WOM in accordance with embodiments of the disclosure.

FIG. 2 is a block diagram of a processing system including an ECC-managed WOM in accordance with embodiments of the disclosure. Generally described, a processing system 200 includes an MCU 204 and a memory controller 210. The MCU 204 and the memory controller 210 are typically arranged on a common substrate 202. The memory controller 210 is communicatively coupled to the MCU 204 and is operable to manage memory accesses to memory devices to (at least) the ECC-managed WOM 140 as well as memory devices such as RAM 292, PROM (programmable read-only memory) 294, and optional EEPROM (electrically erasable read-only memory) 296 (which is optionally formed using a substrate that is different from the substrate 202).

In operation, memory accesses serviced by the memory controller 210 include write operations and read operations. In general, the data conveyed in write operations is transmitted in a top-to-bottom direction as illustrated in FIG. 2, while the data of read operations is transmitted in a bottom-to-top direction as illustrated in FIG. 2. Accordingly, the host interface 220 is arranged to select (e.g., in response to a system address supplied with a memory access command) a memory device of which data is written to or read from.

The memory controller 210 includes the codec 142 for coding and decoding both ECC and WOM codes. The written-once memory (WOM) code allows the memory to be written multiple times without erasure, which increases an otherwise limited device programmability and/or enhance the write/erase endurance of the ECC-managed WOM 140. The codec 142 is a low complexity codec that supports both (e.g., Hamming-type) ECC and WOM codec functionality through the sharing of components between the ECC manager 250 and the WOM manager 260.

The codec 142 includes an ECC controller such as ECC manager 250. During write operations, the ECC manager 250 is operable to apply an error correction code to data for writing to the ECC-managed WOM 140. During read operations, the ECC-manager 250 is operable to evaluate the retrieved data and, if indicated, the ECC controller is operable to execute a corrective action in response to the evaluation (e.g., to correct the retrieved data using ECC-encoded data read from the ECC-managed WOM 140 via the WOM manager 260).

The codec 142 includes the WOM manager 260. During write operations, the WOM manager 260 is operable to encode data (e.g., data encoded by the ECC-manager 260 using an ECC encoding) using a WOM code for writing the WOM (and ECC) encoded data to the ECC-managed WOM 140. During read operations, the WOM manager 260 is operable to decode the WOM-encoded data from the ECC-managed WOM 140. After the WOM-encoded data is decoded, the decoded data is transmitted to the ECC-manager 250 to be further decoded in accordance with the ECC-encoding that was used to originally encode the data written to the ECC-managed WOM 140.

The memory controller 210 includes the memory device interface 270. During write operations, the memory device interface 270 is operable to write the encoded data (e.g., data encoded by the ECC-manager 260 using an ECC encoding and by the WOM manager 260 using a WOM code) to the ECC-managed WOM 140. During read operations, the memory device interface 270 is operable to read the encoded data from the ECC-managed WOM 140. The memory device interface 270 is also operable to perform block initialization routines on the ECC-managed WOM 140 (e.g., to block erase the ECC-managed WOM 140 such that addressed memory locations are all erased/cleared to a logic-zero state.) Typically, the block initialization routines require more time to execute than each read or write cycle of the ECC-managed WOM 140.

In various embodiments, the WOM manager 260 is operable to encode payload data as WOM-encoded data such that the ECC manager 250 encodes the WOM-encoded data. Likewise, the ECC manager 250 is operable to decode ECC-encoded data retrieved from memory such that the WOM manager 260 decodes the WOM-encoded data to retrieve the originally encoded payload data.

WOM encoding can be accomplished using n-bit symbols that are written to WOM memory a limited number of times. For example, TABLE 1 illustrates WOM encoding for 2-bit symbols that can be written to WOM twice (e.g., before memory erasure is required).

TABLE 1

| 2-bit Symbol | 3-bit WOM Code ($1^{st}$ writing) | 3-bit WOM Code ($2^{nd}$ writing) |
|---|---|---|
| 00 | 000 | 111 |
| 01 | 100 | 011 |
| 10 | 010 | 101 |
| 11 | 001 | 110 |

Each row of TABLE 1 illustrates that a 2-bit symbol is WOM-encoded into a 3-bit field. When the WOM-encoded data is written to WOM memory a first time, only one bit (at most) is set in the encoded data. When the WOM-encoded data is written to WOM memory a second time, at least two (of the three) bits are set in the encoded data. Accordingly, the WOM manager 260 is able to determine the number of writes to a WOM location (for storing a WOM-encoded symbol) by reading the data stored in the location (and without, for example, having to rely upon a separate counter for each memory location).

Figure 3:
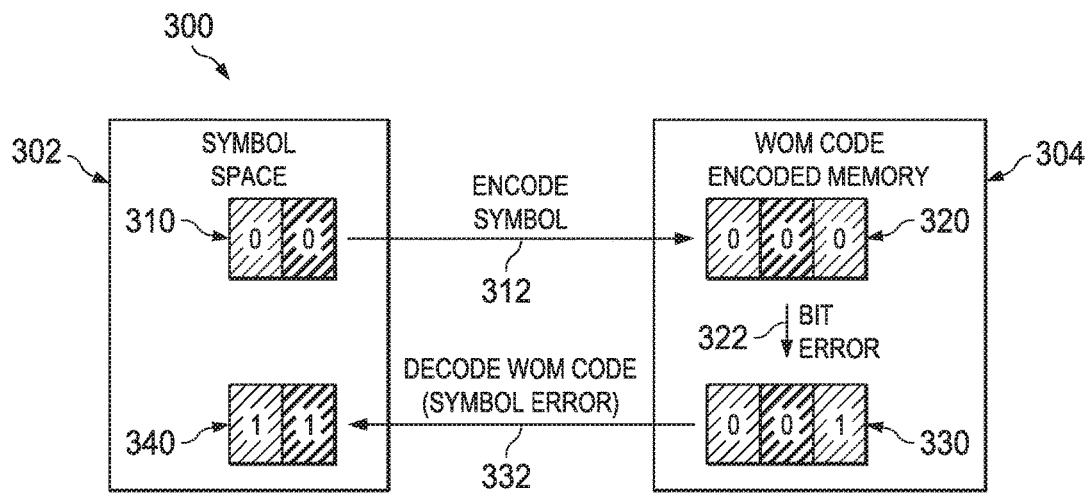
FIG. 3 illustrates symbol-level WOM encoding in an example memory system.

FIG. 3 illustrates symbol-level WOM encoding in an example memory system. Generally described, memory system 300 includes a symbol space 302 and a WOM code encoded memory 304. The symbol space 302 includes a 2-bit symbol 310 having a value (for example) of "00."

In operation 312, the symbol 310 is encoded in accordance with TABLE 1. (It is understood that the principles and techniques described herein can be used with n-bit symbols and is not limited to 2-bits only symbols.) The WOM code encoded memory 304 includes a 3-bit value ("000") 320 for storing the encoded symbol 312 (the erased bit value "0" for the WOM code encoded memory 304 is used for simplicity of illustration, for example). The WOM code encoded memory 304 is subject to bit errors, which can lead to data loss.

In operation 322, an error occurs in the least significant bit of the memory location 320. Despite the use (or non-use) of error-correction codes in encoded data, single or multiple bit errors are possible in the encoded data: the strength of the error correction codes determines the degree to which errors in the encoded data can be corrected in the decoded data. Accordingly, the 3-bit value 320 is erroneously changed to the 3-bit value ("001") 330, which represents a one-bit error.

In operation 332, the 3-bit value ("001") 330 is read and decoded in accordance with TABLE 1 such that the two-bit symbol (representing the decoded 3-bit value 330) has the value "11." The value "1" in the example represents a two-bit error in the symbol, notwithstanding that only a 1-bit error occurred in the WOM code encoded memory 304.

Figure 4:
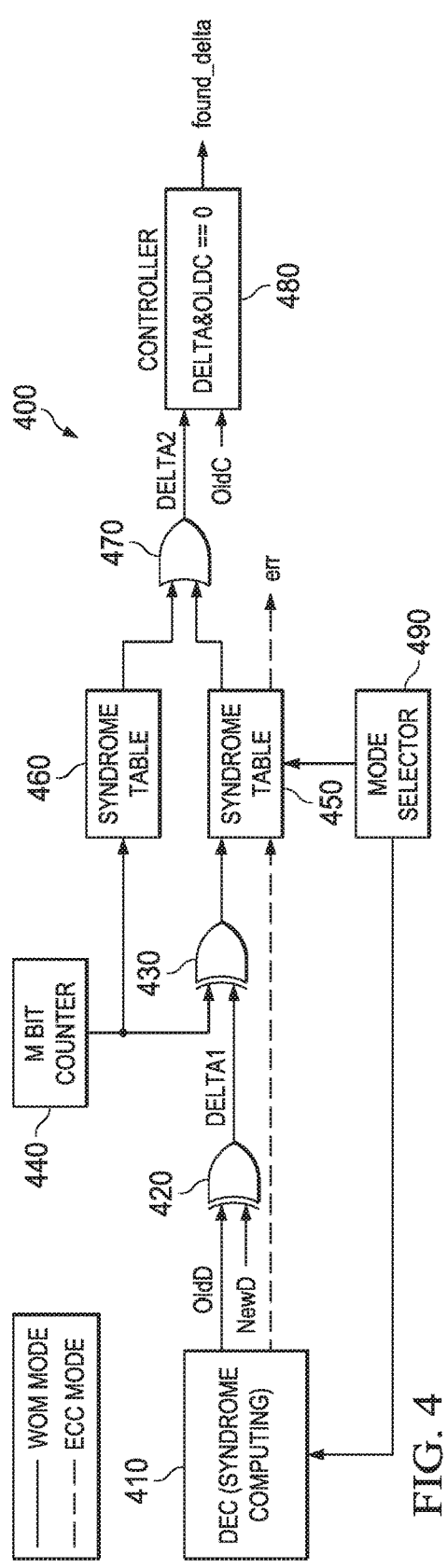
FIG. 4 is a block diagram of a dual mode ECC/WOM codec operating in an ECC mode in accordance with embodiments of the disclosure.

FIG. 4 is a block diagram of a dual mode ECC/WOM codec operating in an ECC mode in accordance with embodiments of the disclosure. The ECC/WOM codec 400 includes decoder (DEC) 410, exclusive-OR (XOR) comparator 420, XOR comparator 430, m-bit counter 440, syndrome tables 450 and 460 (which operate collectively as a single table, or portions of which operate separately as two individually addressable tables, as discussed below), OR-gate 470, controller 480, and mode selector 490. Mode selector 490 is operable to control the operation of the ECC/WOM codec 400 in accordance with a selected mode. For example, a processor (such as CPU 112) is communicatively coupled to the mode selector 490 to place the ECC/WOM codec 400 in either a ECC mode or a WOM mode.

Generally, the ECC/WOM codec 400 is operable for coding and decoding data words stored in memory. In an embodiment, at most, one-bit error is expected (and is correctible) in the ECC/WOM codec 400 (other embodiments are possible where encountered errors of more than one are correctible). The ECC mode of the ECC/WOM codec 400 is described (for example) following, whereas the WOM mode of the ECC/WOM codec 400 is described below with respect to FIG. 6 and FIG. 7.

In the ECC mode, the codec 400 includes a syndrome-computing block operable to compute a syndrome in response to a received ECC-encoded word (e.g., that was previously stored in memory). As discussed below with reference to the following figures, errors (if any in the received ECC-encoded word) are located using the computed syndrome as an index to the syndrome table 450. For example, the signal "error" ("err") is asserted in response to the detection of an error in the received ECC-encoded word. As described below with respect to FIG. 5, the codec 400 is operable to determine the bit-position of the detected error such that the bit having the detected error can be corrected by toggling the value of the bit having the detected error.

Figure 5:
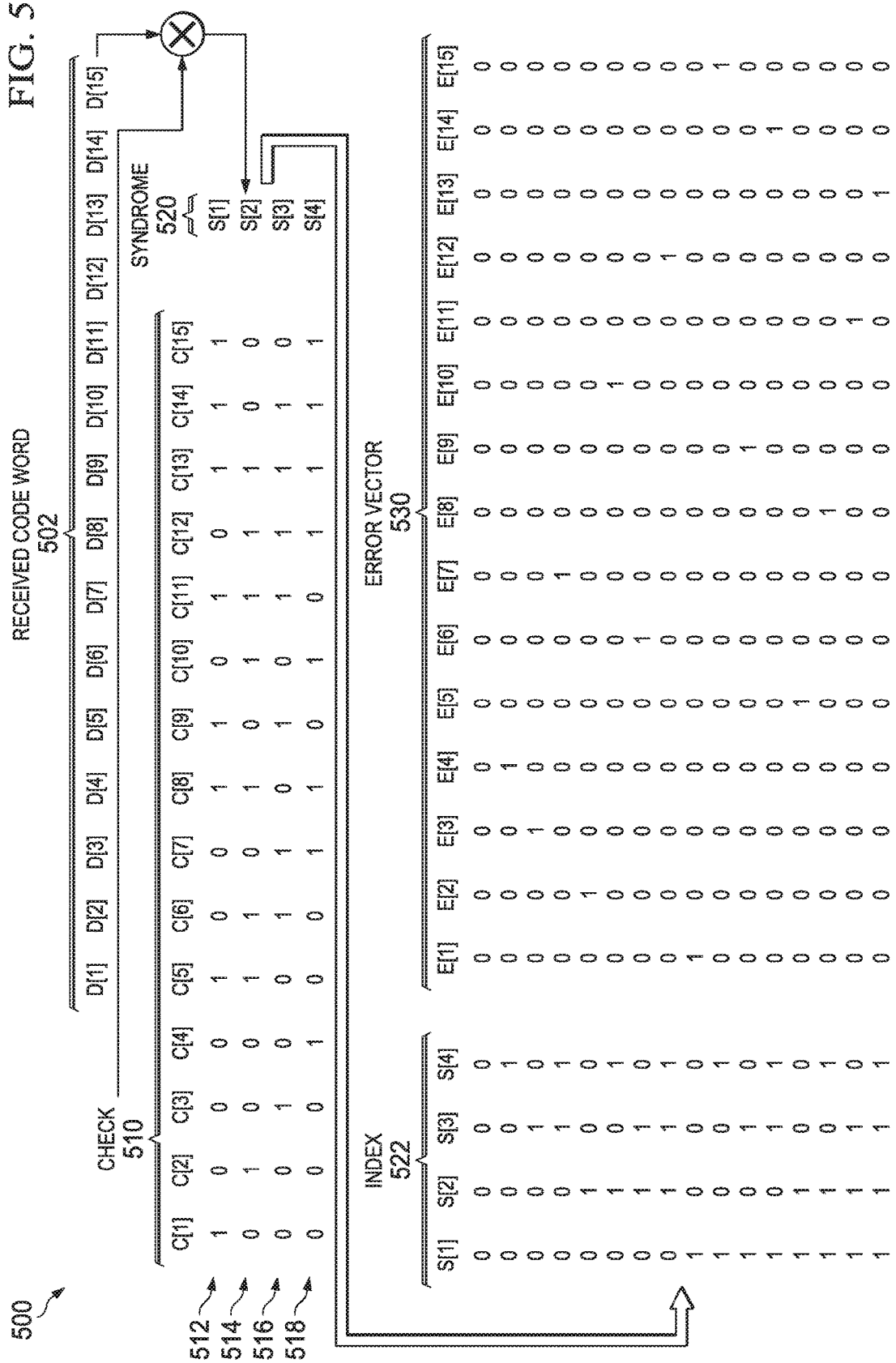
FIG. 5 is data flow diagram for a dual-mode ECC/WOM codec operating in an ECC mode in accordance with embodiments of the disclosure.

FIG. 5 is data flow diagram for a dual-mode ECC/WOM codec operating in an ECC mode in accordance with embodiments of the disclosure. Generally described, data flow diagram 500 illustrates matrix operations of the dual-mode ECC/WOM codec 400 operating in a (e.g., Hamming) ECC decoding mode. For each received code word, a syndrome is computed in response to the value of the received code word. Errors within the received code word are located by indexing the syndrome table in response to the computed syndrome. Data flow diagram 500 includes received code word 502, check matrix 510, syndrome matrix 520, syndrome index 522, and error vector matrix 530.

Received code word matrix 502 is a one-dimensional matrix d[1] through d[15] of a received code word (e.g., a received data vector) wherein each bit is subject to bit errors. Bits d[1] through d[4] are originally encoded as data bits whereas bits d[5] through d[15] are originally encoded as parity bits.

Check matrix 510 is a 4×15 matrix having rows 512, 514, 516, and 518, wherein each row is respectively associated with data bits of the received code word (e.g., bits d[1] through d[4]). Columns c[1] through c[4] each have a set bit, which forms an association with a particular bit of the data bits of the received code word matrix 502. Columns c[5] through c[15] each have one or more bits set to indicate which bits of the data bits of the received code word 502 are used to generate a parity bit for each respective column c[5] through c[15].

Syndrome matrix 520 is generated by vector-multiplying the received code word matrix 502 with check matrix 510. Syndrome matrix 520 indicates, for example, whether the received code word matrix 502 is error-free (e.g., when all bits of syndrome matrix are zero), and if not, which column of the received code word matrix 502 contains a bit error.

When the syndrome matrix 520 includes a non-zero bit value, the syndrome matrix 520 is used to address the index 522 to determine which column of the received code word matrix 502 contains a bit error. For example, error vector matrix 530 includes (ECC) columns e[1] through e[15]. A non-zero value in each of the columns indicates a bit error of a particular bit within the received code word matrix 502. Accordingly, the value of the syndrome matrix 520 is used to select a particular row within the error vector matrix 530, wherein the location of the non-zero bit value in the selected row indicates that particular column in which the detected bit error has occurred. Each row of error vector matrix 530 is a "coset leader," which, in coding theory, indicates a word having the lowest amount of non-zero entities.

Figure 6:
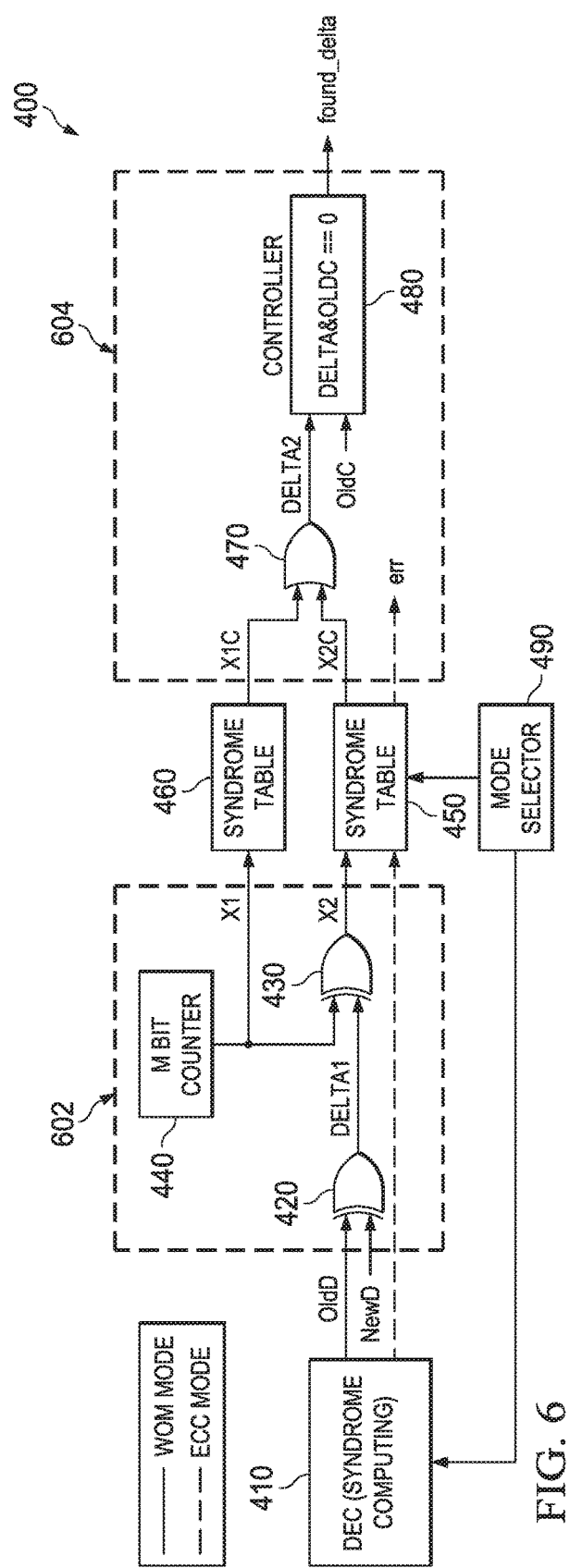
FIG. 6 is block diagram of a dual mode ECC/WOM codec operating in a WOM mode in accordance with embodiments of the disclosure.

FIG. 6 is block diagram of a dual mode ECC/WOM codec operating in a WOM mode in accordance with embodiments of the disclosure. In general, the ECC/WOM codec 400 is operable in a WOM mode for encoding and decoding data words stored in memory in accordance with syndrome computing in which, at most, one-bit error is expected (and is correctible by the associated parity bits).

The ECC/WOM codec 400 operating in the WOM mode repurposes (e.g., "reuses") the syndrome computing block (e.g., including syndrome tables 450 and 460 which operate in accordance with Hamming decoding) that is used while operating in the ECC mode. Because a Hamming decoder with code parameter (size) "m" can also encode/decode a WOM code with symbol size $m_{WOM}$=m−1, the entire portion of the syndrome computing block is not required for the WOM encoding/decoding process when the size of data written to and from WOM is smaller than "m." (As discussed below with reference to FIG. 7, symbols of the WOM mode are 3-bits long, whereas symbols of the ECC mode are 4-bits long.)

In the WOM mode, decoder 410 is operable to decode a WOM-encoded word (e.g., "OldC") received from WOM storage and, in response to such decoding, generate a decoded data ("OldD") word. A new data ("NewD") word is received having information that is to be written to the (for example) same WOM storage location from which OldD was read. In region 602, a search-based process is initiated to determine candidate data words, where each candidate data word is generated in response to the NewD word, and wherein (at least) one of the candidate words is suitable for writing to the same WOM storage location.

The OldD and the NewD signals are compared by the comparator 420, which is a bit-wise XOR gate operable to generate a first delta signal value (e.g., "delta1") in response. The m-bit counter 440 is operable in the search process to generate various count values that are iteratively processed and, for example, compared against the first delta signal value such that an acceptable WOM-encoded candidate is determined (e.g., after iteratively comparing the various count values with the first delta signal value and processing the comparison results as described below). Each generated count value is usually different from a previous count value and is not necessarily generated in a numerically consecutive order.

The count generated by m-bit counter 440 is also used a first candidate data word, which provides an index (X1) for addressing the syndrome table 460. The syndrome table 460 is operable in the WOM mode to generate a first WOM-encoded candidate X1C in response to the first candidate data word X1.

The comparator 430 is operable to compare the first delta signal value with the count generated by m-bit counter 440 to generate candidate data word X22. The candidate data word X2 is operable as an index for addressing the syndrome table 450. The syndrome table 450 is operable in the WOM mode to generate a second WOM-encoded candidate X2C in response to the first candidate data word X2.

The success of each iteration of the candidate search process is evaluated in region 604. For example, the first WOM-encoded candidate X1C is logical ORed (e.g., by OR gate 470) with the second WOM-encoded candidate X2C to generate a second delta signal value ("delta2"). The second delta signal value is logically ANDed (e.g., by controller 480) with the OldC (e.g., the previously programmed WOM encoded value that was read from the WOM storage location). If the result of the controller 480 operation contains all zeroes, then it is determined that a suitable delta candidate for writing to the WOM storage location has been found (e.g., see signal "found_delta"), and no further iterations of the search process are necessary. The suitable delta candidate (X1C) is then written to the addressed WOM storage location.

If the result of the controller 480 operation includes a non-zero value, then it is determined that a suitable delta candidate for writing to the WOM storage location has not been found, and at least one subsequent iteration of the search process is indicated. In each subsequent iteration of a process loop, a different count value (e.g., which is determined by incrementing the counter) is generated and used to produce further candidate values as discussed above.

Mode selector 490 is operable to selectively place the codec 400 in, for example, either of the ECC-mode (e.g., in which ECC-encoding and/or ECC-decoding functions are performed) or the WOM-mode mode (e.g., in which WOM-encoding and/or WOM-decoding functions are performed). Portions (e.g., the decoder 410 and the syndrome table 450) of the codec 400 are "reused" (e.g., operable in both modes), which (for example) reduces the design complexity that would otherwise be required to implement a stand-alone ECC decoder. The mode selector 490 can be implemented in hardware, software, or a combination of both, wherein the implementation is formed on a common or separate substrates.

Figure 7:
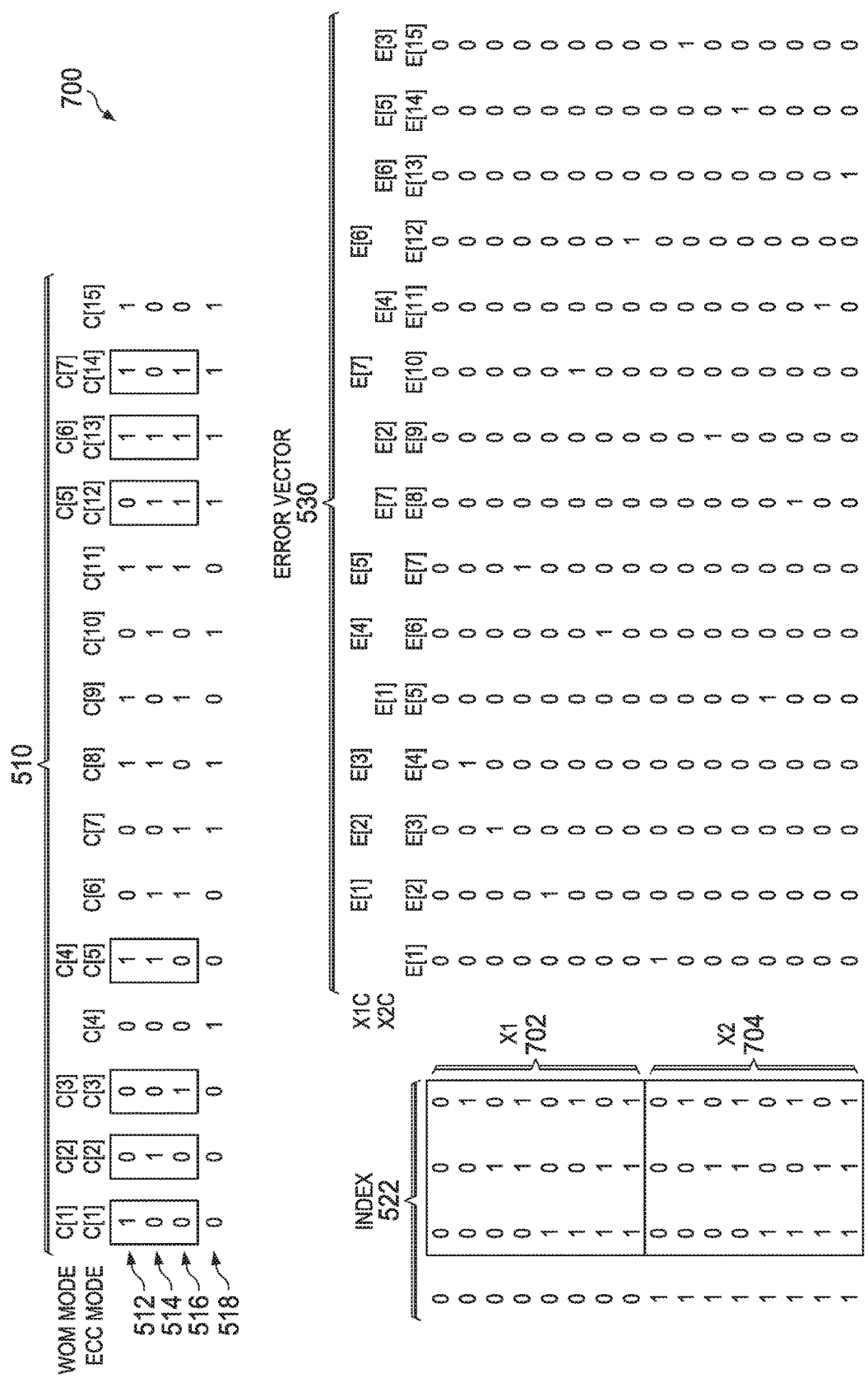
FIG. 7 is a data flow diagram for a dual-mode ECC/WOM codec operating in a WOM mode in accordance with embodiments of the disclosure.

FIG. 7 is a data flow diagram for a dual-mode ECC/WOM codec operating in a WOM mode in accordance with embodiments of the disclosure. Generally described, data flow diagram 700 illustrates matrix operations of the dual-mode ECC/WOM codec operating in a WOM mode.

In the WOM mode, selected portions of check matrix 510 are used. For example, a received WOM-encoded word having eight bits is received. Accordingly, three rows (e.g., rows 512, 514, and 516) of (WOM) columns c[1] through c[8] are selected in WOM mode. Columns c[1] through c[3] (in WOM mode) each have a bit set to form an association with a particular bit of the data bits of a received code word matrix. Columns c[4] through c[7] each have one or more bits set to indicate which bits of the data bits of the received code word 502 are used to generate a parity bit for each respective column c[4] through c[7].

A syndrome matrix X1 (discussed above with respect to FIG. 6) is generated by vector multiplying received the code word matrix 502 with (WOM mode selected locations of) check matrix 510. Syndrome matrix X1 is used to address a first portion 702 of index 522. In a similar fashion, the syndrome matrix X2 (also discussed above with respect to FIG. 6) is used to address a second portion 704 of index 522.

In WOM mode, different groups of selected columns are used for generating the first WOM-encoded candidate X1C and the second WOM-encoded candidate X2C. For example, the first WOM-encoded candidate X1C is associated with the upper eight rows of column e[1] (shared with ECC mode column e[2]), column e[2] (shared with ECC mode column e[3]), column e[3] (shared with ECC mode column e[4]), column e[4] (shared with ECC mode column e[6]), column e[5] (shared with ECC mode column e[7]), column e[6] (shared with ECC mode column e[12]), and column e[7] (shared with ECC mode column e[10]).

Also for example, the second WOM-encoded candidate X2C is associated with the lower eight rows of column e[1] (shared with ECC mode column e[5]), column e[2] (shared with ECC mode column e[9]), column e[3] (shared with ECC mode column e[15]), column e[4] (shared with ECC mode column e[11]), column e[5] (shared with ECC mode column e[14]), column e[6] (shared with ECC mode column e[13]), and column e[7] (shared with ECC mode column e[8]).

Figure 8:
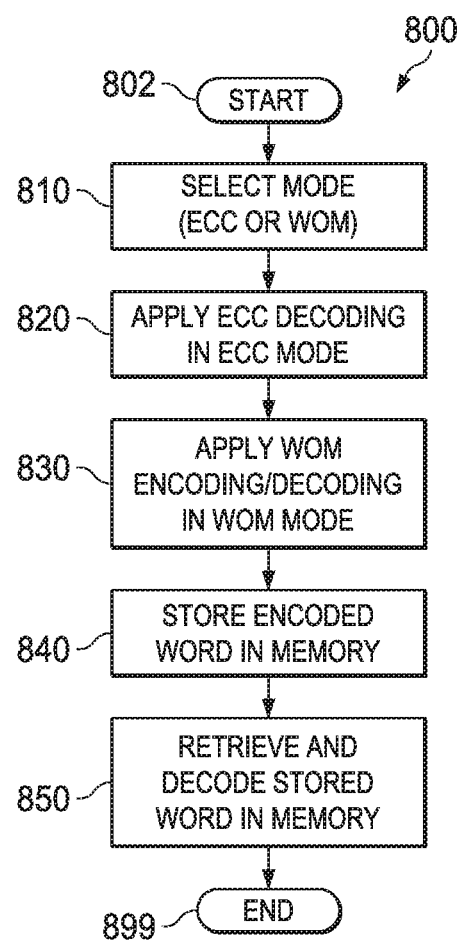
FIG. 8 is a process flow diagram in accordance with embodiments of the disclosure.

FIG. 8 is a process flow diagram in accordance with embodiments of the disclosure. Process flow begins in terminal 802 where process flow proceeds to operation 810. In operation 810, an operating (e.g., operational) mode is selected. For example, one of a WOM (Write-Once Memory) mode and an ECC (error correction code) mode is selected. Because a WOM-encoded word read from an addressed location in the WOM device can be also be ECC-encoded, the mode (e.g., to decode) is selected in an order that compatible with the order of the types of schemes used to originally encode the word. Program flow proceeds to step 820.

In operation 820, an ECC decoding operation is performed on, for example, the encoded word received from the WOM device. Program flow proceeds to step 830.

In operation 830, an WOM encoding/decoding operation is performed when, for example, overwriting a programmed word previously written to the addressed location in the WOM device. The WOM encoding/decoding operation is performed, for example, by reading and decoding the programmed word previously written to the addressed location in the WOM device. The decoded (old) word is used in conjunction with the new word to generate a WOM encoding that is suitable for writing to the addressed location in the WOM device. Program flow proceeds to step 840.

In operation 840, the generated word having WOM encoding that is suitable for writing to the addressed location in the WOM device is stored in the WOM device. Typically the WOM device is block initialized (with each and every WOM bit set or cleared to the same logic state) and is written to by changing a bit from the block-initialization state to a written (e.g., programmed) state (that is the opposite of the block-initialization state). As discussed above, a particular WOM memory location can be overwritten at least once through the use of WOM encoding. Program flow proceeds to step 850.

In operation 850, the word stored in the WOM is retrieved, decoded, and the decoded word evaluated. For example, when the WOM-decoded symbol and the ECC bits read from the WOM device indicate an error, an ECC controller is operable to execute a corrective action in response to the evaluation (e.g., correct a bit error, generate a system interrupt, replace the defective location of the WOM device with a spare storage location, and the like). Program flow proceeds to terminal 899 where program flow terminates.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A circuit, comprising:
   a coder/decoder (codec) including:
      a decoder having a decoder input and a decoder output;
      a first exclusive OR comparator having a first comparator input and a first comparator output, the first comparator input coupled to the decoder output;
      a second exclusive OR comparator having second and third comparator inputs and a second comparator output, the second comparator input coupled to the first comparator output;
      a counter having a counter output coupled to the third comparator input;
      a memory having first, second and third memory inputs and first and second memory outputs, the first memory input coupled to the counter output, and the second memory input coupled to the second comparator output;
      a mode selector having a selector output coupled to the third memory input and to the decoder input;
      an OR gate having an OR gate output and first and second OR gate inputs, the first OR gate input coupled to the first memory output, and the second OR gate input coupled to the second memory output; and
   an OR gate controller having an input coupled to the OR gate output.

2. The circuit of claim 1, wherein the codec is adapted to be coupled to a device, and the codec is configured to:
   in an error correction code (ECC) mode, receive a first data word from the device, and identify a bit position of a bit error responsive to ECC parity bits of the first data word; and
   in a write-once memory (WOM) mode, receive a first WOM-encoded word from an addressable location of the device, generate a second WOM-encoded word including information from a second data word, and write the second WOM-encoded word to the addressable location.

3. The circuit of claim 2, wherein the codec is configured to write the second WOM-encoded word to the addressable location by changing a block-initialized state of selected bits of the first WOM-encoded word.

4. The circuit of claim 2, wherein the first data word and the second data word are a same data word.

5. The circuit of claim 2, wherein the codec is configured in the ECC mode to generate a syndrome according to the first data word.

6. The circuit of claim 5, wherein the codec is configured in the ECC mode to generate the syndrome according to a check matrix.

7. The circuit of claim 6, wherein the codec is configured in the ECC mode to address the memory according to the generated syndrome.

8. The circuit of claim 7, wherein the codec is configured in the WOM mode to address a portion of the memory according to the second data word.

9. The circuit of claim 8, wherein the counter is configured to generate a first candidate data word for addressing a first portion of the memory.

10. The circuit of claim 9, wherein the second exclusive OR comparator is configured to generate a second candidate data word for addressing a second portion of the memory.

11. The circuit of claim 10, wherein the OR gate is configured to generate a second delta word responsive to the first and second memory outputs.

12. The circuit of claim 11, wherein the codec is configured to write the second delta word to the addressable location responsive to a comparison of the second delta word to the first WOM-encoded word.

13. The circuit of claim 10, wherein the second exclusive OR comparator is configured to generate the second candidate data word responsive to comparing a first delta value at the second comparator input to the first candidate data word at the third comparator input.

14. The circuit of claim 13, wherein the first exclusive OR comparator is configured to generate the first delta value responsive to comparing a decoded WOM word at the first comparator input to the second data word, the decoded WOM word being decoded by the decoder responsive to the first WOM-encoded word.

15. The circuit of claim 2, wherein the codec is configured in the ECC mode to generate a syndrome according to the first data word and to address the memory according to the generated syndrome.

16. The circuit of claim 15, wherein the codec is configured in the WOM mode to address a portion of the memory according to the second data word.

17. The circuit of claim 16, wherein the codec is configured to: generate a delta word responsive to the first and second memory outputs, and write the delta word to the addressable location responsive to a comparison of the delta word to the first WOM-encoded word.

* * * * *